United States Patent
Carter et al.

(10) Patent No.: US 9,773,075 B2
(45) Date of Patent: Sep. 26, 2017

(54) UNDERGROUND TACTICAL OPTIMIZATION

(71) Applicant: Dassault Systemes Canada Inc., Montreal (CA)

(72) Inventors: Steve Carter, Brisbane (AU); Chris Snape-Jenkinson, Brisbane (AU)

(73) Assignee: Dassault Systemes Canada Inc., Montreal (CA)

( * ) Notice: Subject to any disclaimer, the term of this patent is extended or adjusted under 35 U.S.C. 154(b) by 951 days.

(21) Appl. No.: 14/134,392

(22) Filed: Dec. 19, 2013

(65) Prior Publication Data

US 2015/0178410 A1    Jun. 25, 2015

(51) Int. Cl.
*G06F 17/50* (2006.01)
*E21C 41/16* (2006.01)
*G06Q 10/04* (2012.01)

(52) U.S. Cl.
CPC .............. *G06F 17/50* (2013.01); *E21C 41/16* (2013.01); *G06Q 10/047* (2013.01)

(58) Field of Classification Search
USPC .............................. 703/1, 2, 7; 52/741, 80.1
See application file for complete search history.

(56) References Cited

U.S. PATENT DOCUMENTS

| | | | | |
|---|---|---|---|---|
| 3,620,573 A | * | 11/1971 | De Villiers Oxford | B28D 1/088 299/18 |
| 3,937,025 A | * | 2/1976 | Alvarez-Calderon F. | E21F 15/04 299/11 |
| 4,056,939 A | * | 11/1977 | Alvarez-Calderon F. | E21F 15/04 249/65 |
| 4,440,448 A | * | 4/1984 | Hoberstorfer | E21C 41/16 299/11 |
| 5,522,676 A | * | 6/1996 | Gryba | E21C 41/16 299/11 |
| 6,857,706 B2 | * | 2/2005 | Hames | E21C 25/16 299/1.1 |
| 9,151,047 B2 | * | 10/2015 | Gryba | E02D 29/055 |
| 2003/0173819 A1 | * | 9/2003 | Hames | E21C 25/16 299/19 |
| 2014/0237936 A1 | * | 8/2014 | Gryba | E02D 29/055 52/741.11 |

OTHER PUBLICATIONS

Newman, A., et al. "A Review of Operations Research in Mine Planning", Interfaces, vol. 40, No. 3, pp. 222-245, May-Jun. 2010.

(Continued)

*Primary Examiner* — Thai Phan
(74) *Attorney, Agent, or Firm* — Hamilton, Brook, Smith & Reynolds, P.C.

(57) ABSTRACT

In an embodiment, a computer-implemented method includes, in a processor, slicing an ore-body solid model stored in a memory into a plurality of horizontal and a plurality of vertical pieces and deriving, from the sliced horizontal pieces and the vertical pieces, information corresponding to stope blocks and pillar blocks of the ore-body, stope blocks and pillar blocks corresponding to particular pieces of the plurality of horizontal pieces and the plurality of vertical pieces.

17 Claims, 9 Drawing Sheets

(4 of 9 Drawing Sheet(s) Filed in Color)

(56) References Cited

OTHER PUBLICATIONS

Villascusa, E., "Quantifying Open Stope Performance", retrieved from Internet, Jul. 26, 2013. http://inside.mines.edu/~anewman/OR_Review.pdf.
Hamrin, H., "Underground Mining Methods and Applications", General Mine Design Considerations, Chapter 1, retrieved from Internet Oct. 7, 2013. www.ct.ufrgs.br/laprom/Underground%20Mining%20Methods.pdf.
Wikipedia, "Dijkstra's algorithm", retrieved from Internet, Dec. 18, 2013. http://en.wikipedia.org/wiki/Dijkstra%27s_algorithm.
Wikipedia, "Bellman-Ford algorithm", retrieved from Internet, Dec. 18, 2013. http://en.wikipedia.org/wiki/Bellman-Ford_algorithm.
Wikipedia, "Shortest path problem" retrieved from Internet, Dec. 18, 2013 .http://en.wikipedia.org/wiki/Shortest_path_problem.
Dassault Systemes Geovia: "Stope Slicer Tool in Surpac", pp. 1; Dec. 4, 2013.
Roussos Dimitrakopoulos et al. "Stope design and geological uncertainty: Quantification of risk in conventional designs and a probabilistic alternative". Journal of Mining Science. Kluwer Academic Publishers—Consultants Bureau. NE. vol. 45. No. 2, pp. 152-163; Jun. 12, 2009.
Ataee-Pour M: "A Critical Survey of the 1.2.8-12 E21C Existing Stope Layout Optimization Techniques". Journal of Mining Science. Kluwer Academic Publishers—Consultants Bureau. NE. vol. 41. No. 5. pp. 447-466; Sep. 1, 2005.
European Search Report for Application No. 14 19 6877 dated Jun. 17, 2016, entitled "Underground Tactical Optimization".

* cited by examiner

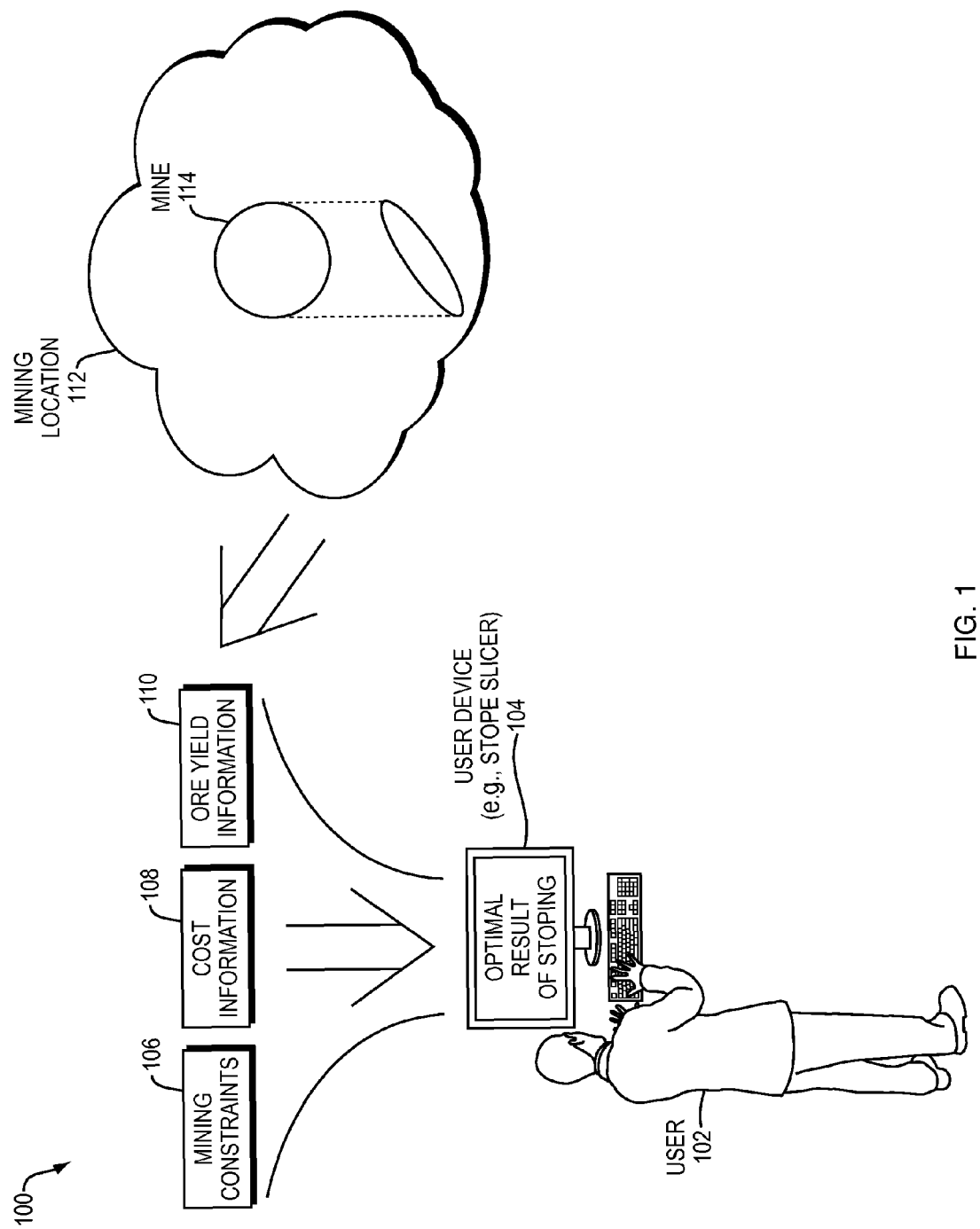

| Z FROM | Z TO | VOLUME | WASTE (t) | ORE (t) | GOLD GRADE | GOLD CONTENT | WASTE MINING COST | ORE MINING COST | REVENUE | BLOCK VALUE | OPTIMIZATION RESULT | FIXED HEIGHT (2015) |
|---|---|---|---|---|---|---|---|---|---|---|---|---|
| 0 | 1 | 29.0 | 74 | 288 | 26.0 | 7492.9 | 668.8 | 2881.9 | 82421.6 | 78870.9 | SUB-LEVEL | SUB-LEVEL |
| 1 | 2 | 15.0 | 15 | 103 | 14.7 | 1515.0 | 134.9 | 1033.4 | 16664.7 | 15496.4 | SUB-LEVEL | SUB-LEVEL |
| 2 | 3 | 31.6 | 93 | 329 | 28.1 | 9252.3 | 833.4 | 3292.6 | 101774.8 | 97648.8 | SUB-LEVEL | SUB-LEVEL |
| 3 | 4 | 13.9 | 13 | 93 | 13.8 | 1280.2 | 114.7 | 926.3 | 14082.3 | 13041.3 | SUB-LEVEL | SUB-LEVEL |
| 4 | 5 | 27.4 | 65 | 264 | 24.7 | 6541.8 | 581.3 | 2644.2 | 71959.7 | 68734.3 | SUB-LEVEL | SUB-LEVEL |
| 5 | 6 | 21.2 | 34 | 177 | 19.7 | 3484.4 | 306.6 | 1768.7 | 38328.4 | 36253.1 | SUB-LEVEL | SUB-LEVEL |
| 6 | 7 | 22.2 | 38 | 191 | 20.5 | 3914.2 | 344.6 | 1905.6 | 43055.8 | 40805.6 | SUB-LEVEL | SUB-LEVEL |
| 7 | 8 | 5.6 | 2 | 25 | 7.1 | 178.5 | 18.2 | 251.4 | 1963.2 | 1693.6 | SUB-LEVEL | SUB-LEVEL |
| 8 | 9 | 35.2 | 123 | 390 | 31.0 | 12090.7 | 1105.8 | 3895.2 | 132997.2 | 127996.2 | SUB-LEVEL | SUB-LEVEL |
| 9 | 10 | 12.9 | 11 | 82 | 13.0 | 1069.6 | 96.5 | 824.0 | 11765.6 | 10845.1 | SUB-LEVEL | SUB-LEVEL |
| 10 | 11 | 28.0 | 68 | 272 | 25.2 | 6850.2 | 609.5 | 2722.7 | 75352.6 | 72020.4 | SUB-LEVEL | SUB-LEVEL |
| 11 | 12 | 17.6 | 22 | 132 | 16.8 | 2214.1 | 195.5 | 1321.1 | 24355.0 | 22838.4 | SUB-LEVEL | SUB-LEVEL |
| 12 | 13 | 45.1 | 236 | 565 | 39.0 | 22059.4 | 2128.0 | 5653.4 | 242653.8 | 234872.5 | SUB-LEVEL | SUB-LEVEL |
| 13 | 14 | 28.0 | 68 | 272 | 25.2 | 6850.2 | 609.5 | 2722.7 | 75352.6 | 72020.4 | SUB-LEVEL | SUB-LEVEL |
| 14 | 15 | 7.2 | 3 | 35 | 8.4 | 294.1 | 28.7 | 351.8 | 3235.6 | 2855.0 | SUB-LEVEL | SUB-LEVEL |
| 15 | 16 | 28.5 | 71 | 280 | 25.6 | 7167.2 | 638.7 | 2801.9 | 78839.7 | 75399.0 | SUB-LEVEL | SUB-LEVEL |
| 16 | 17 | 21.2 | 34 | 177 | 19.7 | 3484.4 | 306.6 | 1768.7 | 38328.4 | 36253.1 | PILLAR | SUB-LEVEL |
| 17 | 18 | 28.5 | 71 | 280 | 25.6 | 7167.2 | 638.7 | 2801.9 | 78839.7 | 75399.0 | PILLAR | SUB-LEVEL |
| 18 | 19 | 7.7 | 4 | 39 | 8.8 | 340.8 | 32.9 | 388.1 | 3748.6 | 3327.6 | PILLAR | SUB-LEVEL |
| 19 | 20 | 11.8 | 9 | 73 | 12.1 | 882.1 | 80.2 | 726.6 | 9703.2 | 8896.3 | PILLAR | SUB-LEVEL |
| 20 | 21 | 7.2 | 3 | 35 | 8.4 | 294.1 | 28.7 | 351.8 | 3235.6 | 2855.0 | PILLAR | PILLAR |
| 21 | 22 | 29.0 | 74 | 288 | 26.0 | 7492.9 | 668.8 | 2881.9 | 82421.6 | 78870.9 | SUB-LEVEL | PILLAR |
| 22 | 23 | 24.8 | 50 | 226 | 22.6 | 5125.9 | 452.8 | 2264.1 | 56385.2 | 53668.4 | SUB-LEVEL | PILLAR |
| 23 | 24 | 35.2 | 123 | 390 | 31.0 | 12090.7 | 1105.8 | 3895.2 | 132997.2 | 127996.2 | SUB-LEVEL | PILLAR |
| 24 | 25 | 4.0 | 1 | 16 | 5.8 | 95.7 | 10.4 | 163.8 | 1052.2 | 878.1 | SUB-LEVEL | PILLAR |
| 25 | 26 | 15.0 | 15 | 103 | 14.7 | 1515.0 | 134.9 | 1033.4 | 16664.7 | 15496.4 | SUB-LEVEL | SUB-LEVEL |
| 26 | 27 | 39.9 | 171 | 471 | 34.8 | 16398.0 | 1535.2 | 4709.4 | 180377.8 | 174133.2 | SUB-LEVEL | SUB-LEVEL |
| 27 | 28 | 15.5 | 16 | 109 | 15.1 | 1641.7 | 145.9 | 1088.7 | 18059.1 | 16824.5 | SUB-LEVEL | SUB-LEVEL |
| 28 | 29 | 28.5 | 71 | 280 | 25.6 | 7167.2 | 638.7 | 2801.9 | 78839.7 | 75399.0 | SUB-LEVEL | SUB-LEVEL |
| 29 | 30 | 33.7 | 109 | 363 | 29.8 | 10819.9 | 982.8 | 3633.3 | 119019.2 | 114403.1 | SUB-LEVEL | SUB-LEVEL |
| 30 | 31 | 31.6 | 93 | 329 | 28.1 | 9252.3 | 833.4 | 3292.6 | 101774.8 | 97648.8 | SUB-LEVEL | SUB-LEVEL |
| 31 | 32 | 4.6 | 1 | 19 | 6.3 | 119.9 | 12.7 | 191.5 | 1318.9 | 1114.6 | SUB-LEVEL | SUB-LEVEL |
| 32 | 33 | 19.1 | 27 | 151 | 18.0 | 2715.1 | 239.1 | 1506.7 | 29866.6 | 28120.7 | SUB-LEVEL | SUB-LEVEL |
| 33 | 34 | 34.7 | 118 | 381 | 30.6 | 11658.0 | 1063.8 | 3807.7 | 128237.7 | 123366.7 | SUB-LEVEL | SUB-LEVEL |
| 34 | 35 | 11.8 | 9 | 73 | 12.1 | 882.1 | 80.2 | 726.6 | 9703.2 | 8896.3 | SUB-LEVEL | SUB-LEVEL |
| 35 | 36 | 51.9 | 345 | 692 | 44.5 | 30771.3 | 3102.8 | 6918.0 | 338484.8 | 328463.9 | SUB-LEVEL | SUB-LEVEL |
| 36 | 37 | 45.6 | 244 | 575 | 39.4 | 22676.0 | 2194.5 | 5749.5 | 249435.6 | 241491.6 | SUB-LEVEL | SUB-LEVEL |
| 37 | 38 | 18.6 | 25 | 144 | 17.6 | 2541.1 | 223.9 | 1443.8 | 27951.7 | 26284.0 | SUB-LEVEL | SUB-LEVEL |
| 38 | 39 | 18.6 | 25 | 144 | 17.6 | 2541.1 | 223.9 | 1443.8 | 27951.7 | 26284.0 | SUB-LEVEL | SUB-LEVEL |
| 39 | 40 | 9.2 | 5 | 51 | 10.0 | 507.2 | 47.6 | 505.2 | 5579.3 | 5026.5 | PILLAR | SUB-LEVEL |
| 40 | 41 | 44.1 | 222 | 546 | 38.2 | 20853.7 | 1999.1 | 5461.9 | 229390.9 | 221929.8 | PILLAR | SUB-LEVEL |
| 41 | 42 | 15.5 | 16 | 109 | 15.1 | 1641.7 | 145.9 | 1088.7 | 18059.1 | 16824.5 | PILLAR | SUB-LEVEL |
| 42 | 43 | 13.9 | 13 | 93 | 13.8 | 1280.2 | 114.7 | 926.3 | 14082.3 | 13041.3 | PILLAR | SUB-LEVEL |

FIG. 2

UNDERGROUND TACTICAL OPTIMIZATION

BACKGROUND

Typically, a mining engineer employs a site specific convention and historical practice to determine the locations for crown pillars/sub-levels and pillars/stopes. Stoping is, generally, a process of extracting ore from an underground mine. This leaves behind an open space, which is known as a "stope." A pillar is untouched mining material. A crown pillar is a pillar of ore left for safety and stability reasons between the base of the open-pit and the first level of underground mining and between stopes at different levels in the underground mine to ensure adequate support/safety. The site specific convention often employs fixed height/width strategies for sub-levels/crown pillars and stopes/pillars. An example of a fixed height/width strategy is setting all sub-levels to be 30 m high and all crown pillars to be 5 m high.

SUMMARY

In an embodiment, a computer-implemented method includes, in a processor, slicing an ore-body solid model stored in a memory into horizontal and vertical pieces and deriving, from the sliced horizontal pieces and the vertical pieces, information corresponding to stope blocks and pillar blocks of the ore-body, stope blocks and pillar blocks corresponding to particular pieces of the horizontal pieces and the vertical pieces.

The derived information of the stope blocks and pillar blocks can include a volume, mass, grade, or metal content of the respective stope block or pillar block.

In an embodiment, the method can further include selecting given horizontal pieces and given vertical pieces forming an optimal path through the ore-body based on constraints of height and width and presenting the optimal path to a user. Selecting the given horizontal pieces and given vertical pieces forming the optimal path can include considering geotechnical parameters, ore-body site conventions, and equipment operating parameters. Presenting the optimal path to the user includes presenting a 3D-representation of the pieces to the user or presenting a spreadsheet illustrating the pieces to be selected for the optimal path.

Selecting the given horizontal pieces and given vertical pieces forming the optimal path further can include creating and solving a weighted digraph representing a collection of multiple contiguous slices by: (i) creating a first vertex for a starting position, the starting position corresponding to a fixed pillar preceding a first slice of the contiguous slices, (ii) creating a second vertex for an ending position, the ending position corresponding to a fixed pillar that follows a last slice of the contiguous slices, (iii) for each subgroup of contiguous slices that satisfies a given set of height and width constraints to allow a pillar, creating a corresponding vertex, (iv) for the created vertices of (i)-(iii), connecting two vertices by an edge if, given a set of height and width constraints, a separation can be placed between the slices represented by the two vertices that allows space for a stope, (v) setting edge directions to be away from the first vertex and towards the second vertex, (vi) for each edge, setting the weight of the edge by either combining a value of the slices represented by the corresponding source vertex of the edge or combining the value of the slices representing by the corresponding destination vertex of the edge, (vii) for the weighted digraph of (i)-(vi), determining the shortest path from the first vertex to the second vertex. The shortest path can be an optimal path of designing stopes and pillars in the ore-body. An optimal path is a solution to the graph that maximizes the value of the mine, where the value of the mine may be based on factors including, but not limited to, the economic value of the mine, the amount of metal recovered from the mine, etc. The factors can be set by an engineer or user of the system, for example.

In an embodiment, the ore-body model represents a boundary of a shape to be mined. The ore-body model can be a triangulated mesh.

In an embodiment, a computer-implemented system can include a slicing module configured to slice an ore-body solid model stored in a memory into horizontal and vertical pieces. The system can further include an analysis module configured to derive, from the sliced horizontal pieces and vertical pieces, information corresponding to stope blocks and pillar blocks of the ore-body, the stope blocks and pillar blocks corresponding to particular pieces of the horizontal pieces and the vertical pieces.

In an embodiment, a non-transitory computer-readable medium configured to store instructions for analyzing an ore-body solid model. The instructions, when loaded and executed by a processor, causes the processor to slice the ore-body solid model stored in a memory into horizontal and vertical pieces, and derive, from the sliced horizontal pieces and vertical pieces, information corresponding to stope blocks and pillar blocks of the ore-body, stope blocks and pillar blocks corresponding to particular pieces of the horizontal pieces and vertical pieces.

While operations research is used in mining, no operations research method solves the specific problem of choosing the optimal locations for crown pillars/sub-levels and pillars/stopes. Commonly, a mining engineer can vary pillar height/width parameters without unduly compromising safety and can vary sub-level/stope height/width parameters without unduly compromising equipment operating parameters. Compliance with fixed height/width site specific conventions exclude consideration of alternate configurations that may give a superior economic result while complying with geotechnical and operational constraints. Even if a mining engineer chooses to consider a number of alternative configurations from which the best may be chosen it is unlikely that an exhaustive evaluation is performed to deliver the optimum configuration. Such non-exhaustive evaluation strategies do not often yield an optimum configuration that maximizes the value of the mined material.

BRIEF DESCRIPTION OF THE DRAWINGS

The patent or application file contains at least one drawing executed in color. Copies of this patent or patent application publication with color drawings will be provided by the Office upon request and payment of the necessary fee.

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIG. 1 is a high level block diagram illustrating an example embodiment of the present invention.

FIG. 2 is a table illustrating results of the optimization to determine the locations of crown pillar/sub-level boundaries.

DETAILED DESCRIPTION

Figure 3:
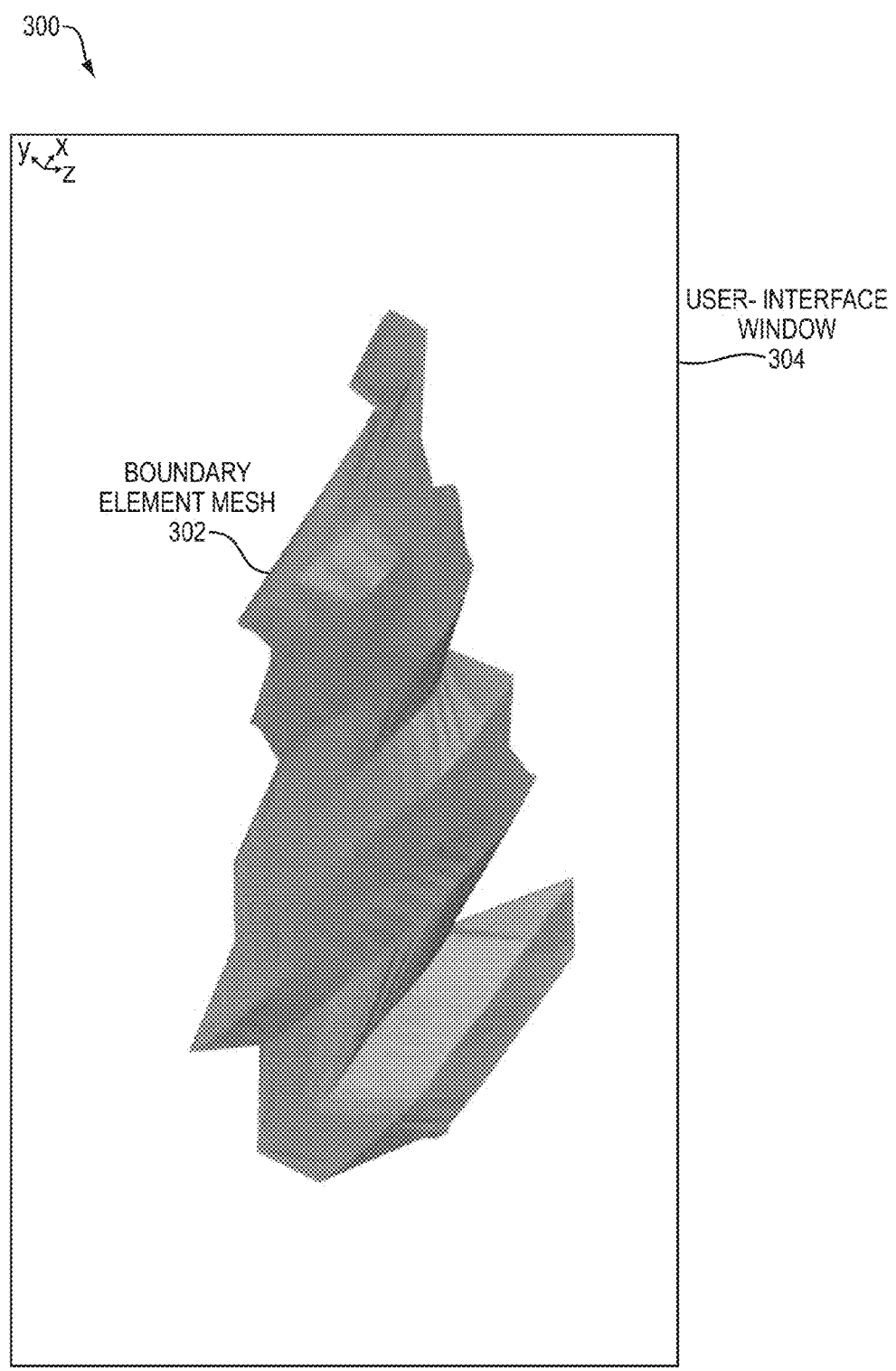
FIG. 3 is a diagram illustrating a user interface window showing a boundary element mesh representing the ore-body to be mined.

A description of example embodiments of the invention follows.

A mining engineer should consider various factors when using these site specific conventions. One factor the mining engineer considers is geotechnical constraints of minimum crown pillar height and pillar thickness. A geotechnical engineer establishes the geotechnical constraints by following a geotechnical study to ensure sufficient strength of the surrounding rock and post excavation of sub-levels and stopes. The geotechnical constraints help maintain stable ground conditions. A second factor is a minimum sub-level height and stope thickness (e.g., along an ore-body strike). The minimum sub-level height and stope thickness are chosen to be compatible with pillar height/thicknesses and to suit operational characteristics of the chosen mining equipment.

A design engineer may utilize embodiments of the present invention to design underground mine stopes, for example, for sub-level open stoping and bighole stoping mining, and for operations research, for example by determining an optimal result from a range of different crown pillar/sub-level and pillar/stope configurations, among other applications.

Embodiments of the present invention can assist in sub-level open stoping and bighole stoping mining methods to determine locations of boundaries between crown pillars and sub-levels in the vertical direction and boundaries between pillars and stopes along an ore-body's strike direction. Embodiments of the present invention can determine such locations subject to practical mining constraints such as (i) minimum and maximum thickness of crown pillars in the vertical direction, (ii) minimum and maximum thickness of sub-levels in the vertical direction, (iii) minimum and maximum thickness of pillars along the strike direction of an ore-body, and (iv) minimum and maximum thickness of stopes along the strike direction of an ore-body. Other examples of constraints are minimum and maximum height for a sub-level, minimum and maximum height for a crown pillar between sub-levels, and no pillars being required before the first or after the last sub-level. Determining such locations allows maximization of the value of the material mined based on estimates of cost of mining waste material, cost of mining ore, recovery of mined ore (e.g., expressed as a percentage), cost of processing ore, recovery of ore during the beneficiation process (e.g., expressed as a percentage), and/or revenue earned for the metal recovered from the beneficiation process.

Current methods of determining the optimum locations of crown pillar/sub-level and pillar/stope boundaries are hampered by at least three problems. First, current methods can only evaluate a single case or a small number of cases and choose the best case of the small number of evaluated cases. These current methods are non-exhaustive and result in a configuration that does not maximize the value of material mined unless, by coincidence, it happens to analyze the optimal solution, and generally produce a non-optimal value of material mined. Current methods do not consider all possible configurations because the process is computationally intensive and time consuming, few mining engineers have the skills and experience to undertake optimization studies and no suitable software tools exist to simplify the calculations that provide the data required to complete an optimization study.

Practical mining geometry can be discretized into units of convenience for optimization. Units of convenience can be thin horizontal slices determining optimum locations of crown pillars/sub-levels and/or thin vertical slices, perpendicular to the direction of ore-body strike, determining optimum locations of pillars/stopes. Evaluation of the units of convenience can determine the mass of waste and the mass of ore, the metal content of ore, the value of each slice given the costs of mining ore and waste, a mining recovery factor, processing cost, processing recovery factor, revenue for recovered metal and ultimately the value of the economic value of a slice. Optimal location of pillar/mining block boundaries can be found using these discretized slices by choosing an optimal configuration from all possible combinations to maximize the value of the resultant configuration.

An advantage of an embodiment of the present invention is consideration of a broader range of alternatives rather than only evaluating one or a small number of alternatives based on site specific convention. Another advantage of an embodiment of the present invention is, for a given set of height/width constraints, maximizing the crown pillar/sub-level pillar/stope configuration given a set of cost, recovery and revenue parameters. Yet another advantage of an embodiment of the present invention it calculates an optimum result faster.

A computer-based feature of the present invention (e.g., the Stope Slicer for the Surpac product offered by Dassault Systémes GEOVIA Inc.) slices an ore-body solid model (e.g., a triangulated mesh representing the boundary of an overall shape to be mined) into a number of horizontal and vertical pieces and evaluates each of these using an associated block model (e.g., a voxel-like model depicting the spatial variation of mineral grades) to derive a volume, mass, grade, and metal content of the stope blocks and pillar blocks. Geotechnical parameters for pillar height/thickness and local conventions for sub-level/stope height/width factor into the configuration for underground mines that employ sub-level open stoping and bighole stoping types. The Stope Slicer feature can therefore create thin slices of a practical mining shape represented by boundary element mesh and evaluate each of these slices using an associated block model to derive the economic value for a slice. The set of economic values for the slices can be used with some sort of spreadsheet analysis to determine the best locations for the sublevel/stope boundaries. With this set of data, a maximized economic value can be calculated using height/width as constraints.

In an embodiment, the thin slices can be all of the same thickness. A mining engineer defines the ore-body (e.g., solid) to satisfy a minimum mining width criteria as the shape to be mined during a multi-sublevel stoping operation. Each slice is defined by positions "Z-from" and "Z-to." The positions "Z-from" and "Z-to" together define the thickness of the slice. Each slice includes information about its volume and mass of ore, waste material and grade of ore of the waste material.

FIG. 1 is a high level block diagram 100 illustrating an example embodiment of the present invention. A user 102 employs a user device 104 (for example, employing the Stope Slicer system) to input information about a mining location 112 and a corresponding mine 114. The mine 114 can correspond with an ore-body, and therefore can be modeled as an ore-body model. The information can include mining constraints 106, cost information 108 and ore yield information 110. The information can also include the solid that is to be mined. This solid can be created using solid modeling tools (e.g., Surpac or GEMS, both offered by Dassault Systémes GEOVIA Inc.). The solid's geometry satisfies certain properties, such as minimum width. The solid model can also include both ore and waste material.

The input information can also include a block model populated with mineral grades, specific gravity and rock types to qualify and quantify the material to be mined. The input information can also include the costs of mining ore, the cost of mining waste, cost of processing ore, plant recovery factors and revenue for the recovered metal. The input information can also include other factors that affect slice value calculation. These costs and other parameters can be defined as constant values or can vary spatially by assigning different values to different blocks in a block model using elevation, rock type or other means for defining the spatial variation.

The user device 104 determines an optimal stope and pillar configuration of the mine 114 based on the inputted information. The user device 104, in one embodiment, can build a weighted digraph (e.g., a directed graph) based on the information, where the weighted digraph represents horizontal and vertical slices of the mine 114. The user device 104 can then determine a shortest path through the weighted digraph. The shortest path through the weighted digraph represents the optimal configuration of the sub-levels/crown pillars or stopes/pillars.

FIG. 2 is a table 200 illustrating results of the optimization to determine the locations of crown pillar/sub-level boundaries with the optimum configuration in the column titled "Optimization result," compared to a fixed height convention of 20 m sub-level heights and 5 m crown pillar heights in the column titled "Fixed height (20/5)." Contiguous groups of cells shown with a shaded background are aggregated into a sub-level and contiguous groups of cells with a clear background are aggregated into a crown pillar. For example, in the optimized results, slices having a Z-From value of 0 to 15 are grouped in a first sub-level, slices having a Z-From value of 21 to 38 are in a second sub-level, slices having Z-From value of 16 to 20 are grouped in a first pillar, and slices having a Z-From value of 39 to 42 are grouped in a second pillar. In the fixed height analysis, however, slices having a Z-from value of 0 to 19 are in a first sub-level, slices having a Z-from value of 25 to 42 are grouped a second sub-level, and slices having a Z-from value of 20 to 24 are grouped in a first pillar.

Although not shown by FIG. 2, a similar aggregation occurs along the ore-body strike direction using each of these previously determined sub-levels to determine the optimum configuration along strike. An optimization module performs an optimization to determine the optimal configuration shown in FIG. 2 by selecting slices with the minimum combined value to describe an arrangement of pillars satisfying the specified height/width constraints.

A comparison of the result of the optimization module to an alternative configuration of using fixed height sub-levels (20 m) and pillars (5 m) shows an improvement of around 14% in the value of material mined through optimal positioning of the sub-levels and pillars.

The example of FIG. 2 shows determined optimal locations of sub-level boundaries, however, the embodiments of the present invention can also determine optimal location of stope boundaries. The stope slicer can determine the optimal configuration of a collection of adjacent slices to maximize the value of the material mined and processed. The stope slicer can determine an optimal location of a path of slices regardless of whether the orientation of the slices are horizontal, vertical or at any other orientation as long as the slices are parallel relative to each other and immediately adjacent to each other. The practical benefit to the mining engineer is that an optimization study guides the mining engineer to a stope or sub-level configuration that maximizes value and guides the location of declines and access drives for mining and removal of ore and waste.

For a group of contiguous slices, the potential solutions for the optimal configuration are represented mathematically by a graph of vertices connected by edges with particular direction and weight. This weighted digraph has six conditions. First, a vertex exists for a starting position, which is analogous to a fixed pillar that precedes the first slice. Second, a vertex exists for an ending position, which is analogous to a fixed pillar that follows the final slice. Third, a vertex exists for every contiguous subgroup of slices satisfying the height/width constraints to allow a pillar. Fourth, two vertices are connected by an edge if the two vertices satisfy the height/width constraints to allow a separation between the corresponding pillars. Fifth, edge directions are away from the starting position vertex and towards the ending position vertex. Sixth, edge weights are either the combined value of the slices represented by the source vertex for every edge or the combined value of the slices represented by the destination vertex for every edge. Edge weights, therefore, can be created by combining value of the slices represented by the source vertex for every edge or by combining values of the slices represented by the destination vertex for every edge.

The optimization module employs the weighted digraph to determine the optimal solution by finding the shortest path to connect the starting position vertex to the ending position vertex by following directed edges through a series of vertices such as to minimize the combined edge weights. In an embodiment, Dijkstra's shortest path search can be employed when all of the edge weights are positive and the Bellman-Ford shortest-path search can be employed when any of the edge weights are negative. Embodiments described herein are not limited to either the Dijkstra or Bellman-Ford shortest-path search but may use any suitable shortest-path searching algorithm. The vertices that form the final path correspond to a selection of slices with the minimum combined value to describe an arrangement of pillars that satisfies the specified height/width constraints, which maximizes the value of the mined material.

To initialize the optimization module analysis, the user defines a number of inputs. First, the user defines the solid (e.g., ore-body) to determine optimal mining/pillar boundaries. The user further inputs the start plane (horizontal, vertical or other/inclined) for the slices and thickness of each slice. The user further inputs the block model and attributes to be used to determine the value of each slice. The attributes can include (i) a specific gravity attribute, (ii) a rock type (e.g., material category) attribute, (iii) a rock code attribute/flag that indicates waste, where all other rock types would be considered ore, and (iv) a metal grade attribute. The user further inputs properties to calculate the value of a slice, including (i) waste mining cost per unit of mass, (ii) ore mining cost per unit of mass, (iii) ore processing cost per unit of mass, (iv) revenue per unit of metal mass, (v) ore mining recovery and (vi) ore processing recovery. The properties can be stored in the block model, which allows greater flexibility in calculating the slice values.

The optimization module outputs a table/spreadsheet including, (i) for each slice, the "Z-from" and "Z-to" distances of the slice from the starting plane, (ii) for each slice, the slice properties, specific gravity, metal grade, metal content, ore and waste masses and slice value, (iii) an aggregated configuration of the mining and pillar configurations of slices with "from" and "to" distances for each mining block and pillar block, (iv) aggregate metal content and value of each mining block and pillar block and (v) a number of solids representing the mining blocks and pillar blocks.

In a best case scenario where all slices can be mined, adding the value for every slice yields the potential maximum value. However, constraints limit mining between certain lengths (e.g., a minimum and maximum height for a sub-level) that are separated by certain lengths (e.g., a minimum and maximum height for a pillar). By selecting pillars formed from neighboring slices with the minimum combined pillar value to satisfy the constraints, the remaining slices determine the sub-levels that satisfy the constraints and have the maximum value.

The system creates a weighted digraph, which is a graph that consists of vertices connected by edges with particular direction and weight. Each allowed pillar of neighboring slices that satisfy the pillar constraints represents a vertex, having two 'virtual' vertices: a 'start' vertex and an 'end' vertex. The system sorts the 'pillar' vertices according to distance from the starting slice. Then, the system can create an edge from the 'start' vertex to every 'pillar' vertex that satisfies the sub-level constraints, with the weight of the edge being the value of the pillar. Similarly, each 'pillar' vertex can be connected to other 'pillar' vertices and eventually the 'end' vertex. The system therefore creates all potential allowed paths to connect the 'start' vertex to the 'end' vertex because the 'pillar' vertices are initially sorted. The system can then find the shortest path through the graph to obtain an optimal solution. The optimal solution is the set of vertices (e.g., pillars) with the least accumulated weight (e.g., value) to traverse the graph. The system can find one optimal solution or multiple, non-unique optimal solutions to the graph.

FIG. 3 is a diagram 300 illustrating a user interface window 304 showing a boundary element mesh 302 representing the ore-body to be mined (e.g., mine 114 of FIG. 1). The ore-body to be mined is an input to the optimization module, as well as information regarding the ore-body. As described above, the ore-body to be mined can be modeled by a user in 3D modeling software.

Figure 4:
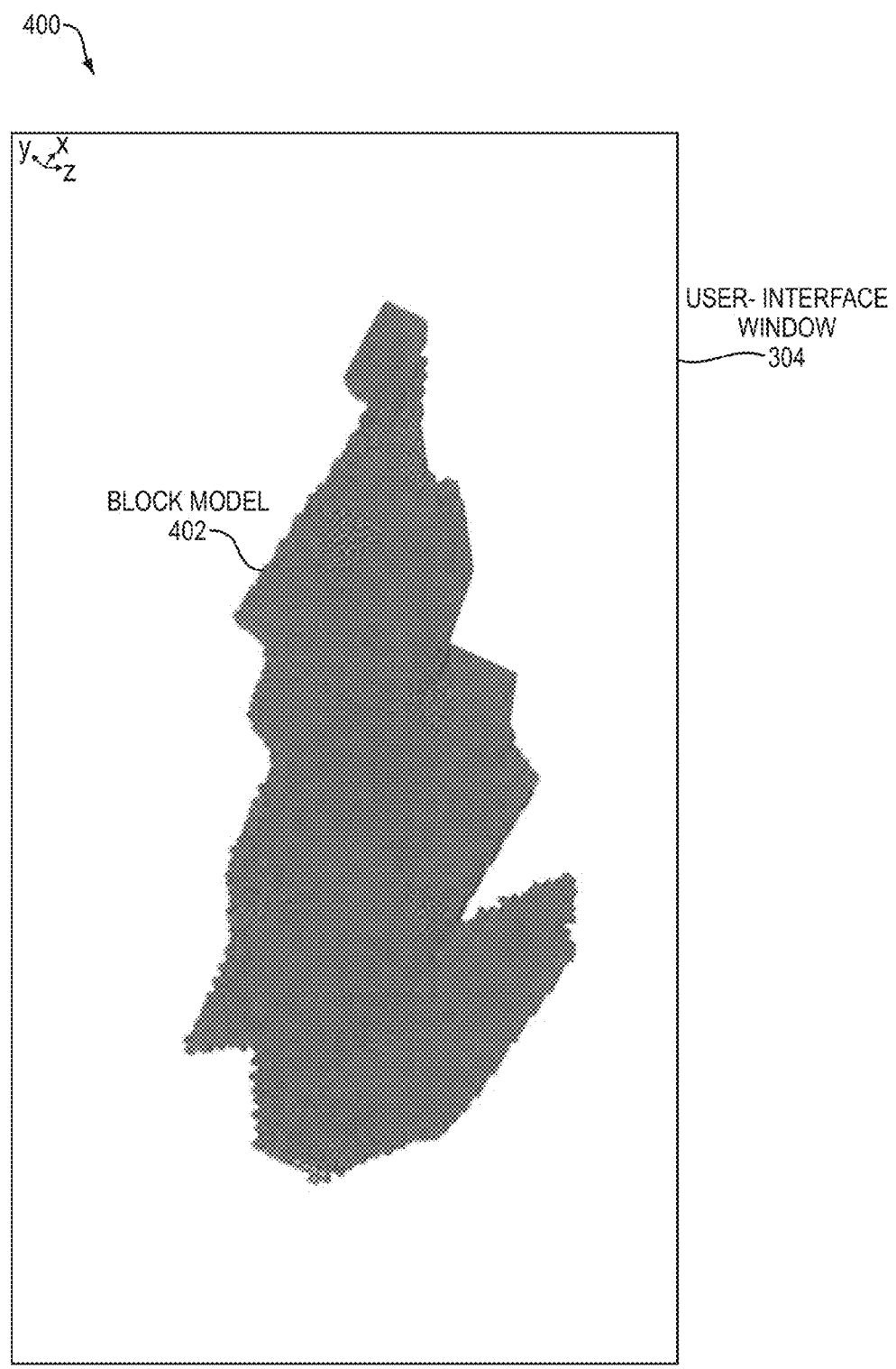
FIG. 4 is a diagram illustrating the user-interface window showing a block model used to represent the spatial distribution of the mineral grade within the ore-body.

FIG. 4 is a diagram 400 illustrating the user-interface window 304 showing a block model 402 used to represent the spatial distribution of the mineral grade within the ore-body. The block model can also include attributes used to determine the value of each slice. Attributes can include specific gravity, rock type, a rock code indicating waste, and a metal grade attribute. Each block can be further associated with an elevation. The attributes associated with the block can be means for defining special variation of the blocks. The color of each block in the block model 402 represents the attributes of that block. For example, the color can represent a composite value of the block, or a specific attribute input by the user. The mining engineer can switch the views of the user-interface window 304 to highlight different attributes or combined attributes of the block model 402.

Figure 5:
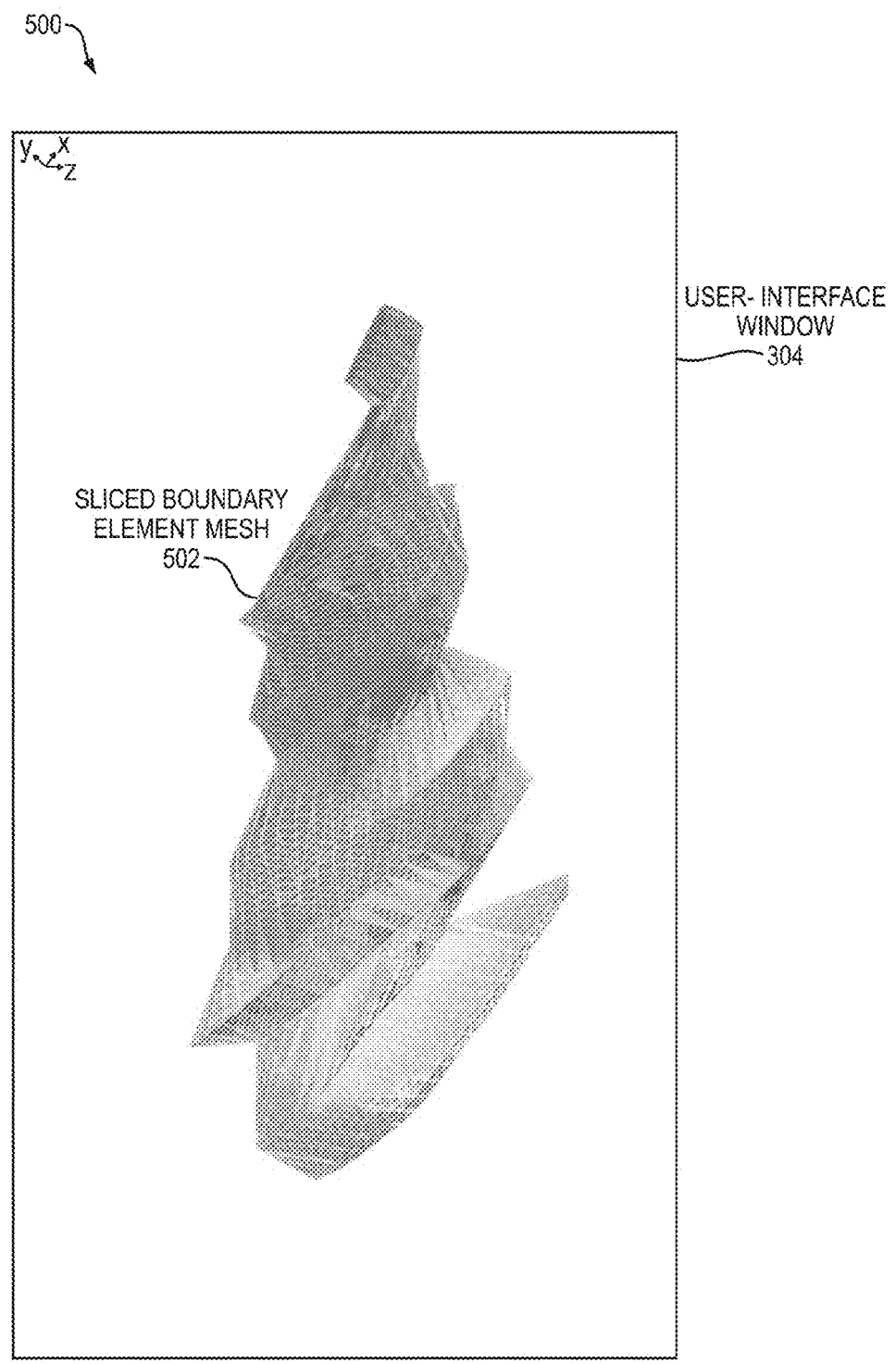
FIG. 5 is a diagram illustrating a sliced boundary element mesh shown in the user-interface window.

FIG. 5 is a diagram 500 a sliced boundary element mesh 502 shown in the user-interface window 304. The system slices the boundary element mesh 302 of FIG. 3 into thin slices along strike direction, or along any orientation common to all of the slices. Each polygonal region of the boundary element mesh represents a slice. In an embodiment of the present invention, the system adds the slices along the strike direction to the mesh of the ore-body. The system can also add color grading, from red to blue, each slice having a different color along the gradient. The color grading, in an embodiment, can represent an position (e.g., elevation, horizontal position) of the slice. In the example of FIG. 5, the color represents a position on the x-axis, where the slices colored most red along the color gradient have the lowest x-axis position and the slices colored most blue along the color gradiant have a highest x-axis position.

Figure 6:
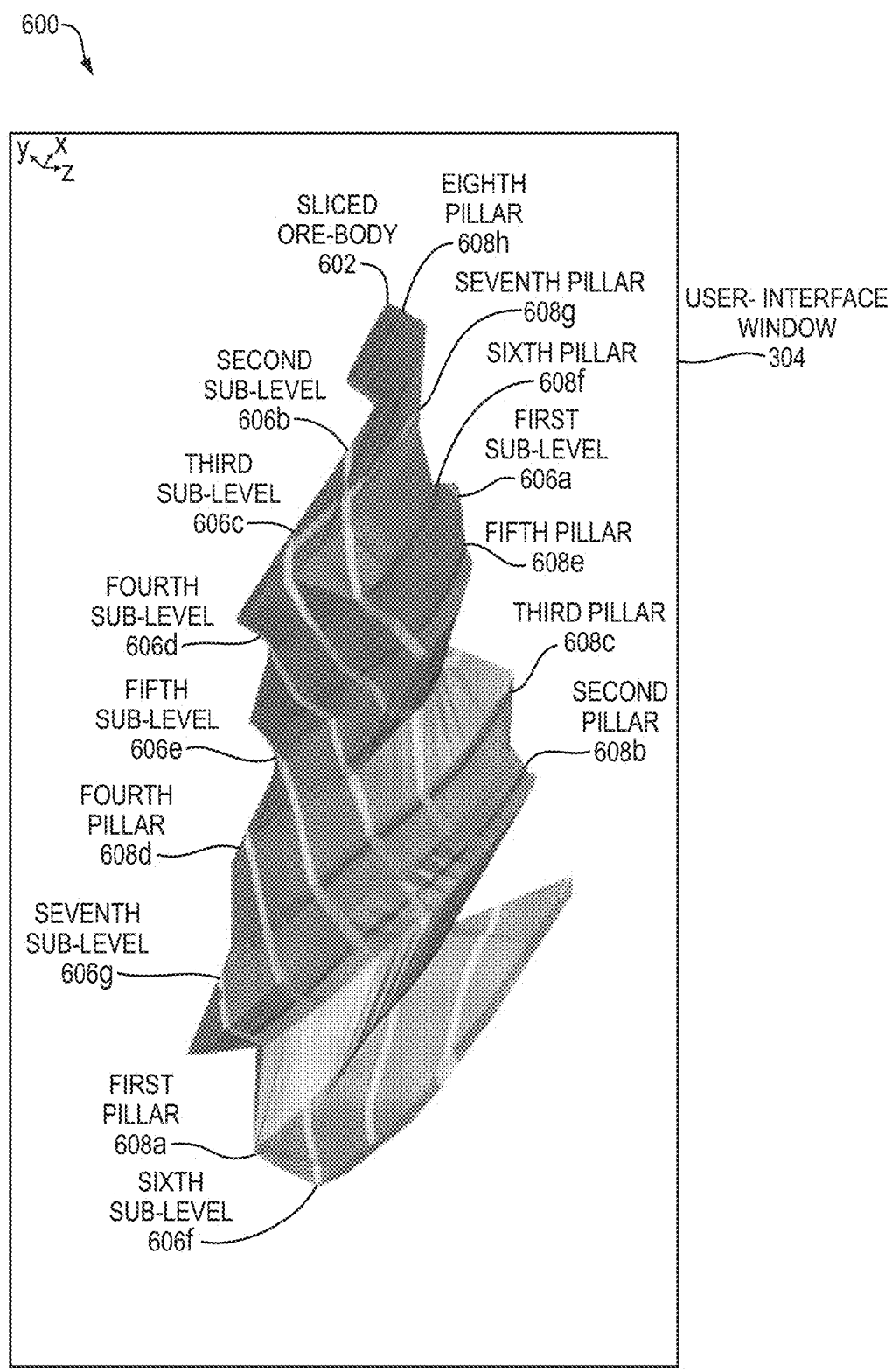
FIG. 6 is a diagram illustrating an example of the sliced ore-body shown in the user-interface window.

FIG. 6 is a diagram 600 illustrating an example of the sliced ore-body 602 shown in the user-interface window 304. The sliced ore-body 602 is created as a result of an embodiment of the present invention. The sliced ore-body 602 is sliced into sub-levels 606a-g and stopes with crown pillars between sub-levels 606a-f (e.g., shown as yellow stripes) and pillars 608a-h between stopes (shown as brown stripes). The created sub-levels 606a-g and pillars 608a-h give an optimal economic configuration given the inputted constraints, costs and revenues.

An optimal configuration of crown pillar/sub-levels and pillar/stopes represents the geometric shape to be mined. The geometric shape is sliced into thin horizontal slices. The stope slicer evaluates each horizontal slice using an associated voxel representation of the spatial distribution of mineral grade and categorization of material types into waste and one or more types of ore. The optimization module evaluates each horizontal slice using estimates of mining costs for waste and ore, mining recoveries, processing costs, processing recoveries and revenue for the liberated metal to derive an economic value for the slice. Constraints for minimum and maximum thickness for the crown pillars and sub-levels are further defined.

Optimizing the economic value can be performed by employing an optimization methodology such as shortest path or a graph optimization such as Dijkstra's shortest path search or Bellman-Ford search to determine locations of crown pillars/sub-level boundaries such that the value of the slices aggregated into pillars is minimized or value of slices aggregated into sub-levels is maximized. The resultant sub-levels are then sliced into thin vertical or near to vertical slices on planes perpendicular to the direction of the ore-body strike. Each of these thin slices is evaluated using an associated voxel representation of the spatial distribution of mineral grade and categorization of material types into waste and one or more types of ore. The optimization module determines locations of pillars/stope boundaries such that the value of the slices aggregated into stopes is maximized. The locations of pillars in each of the sub-levels allow the pillar to extend vertically through all sub-levels to satisfy geotechnical considerations.

Figure 7:
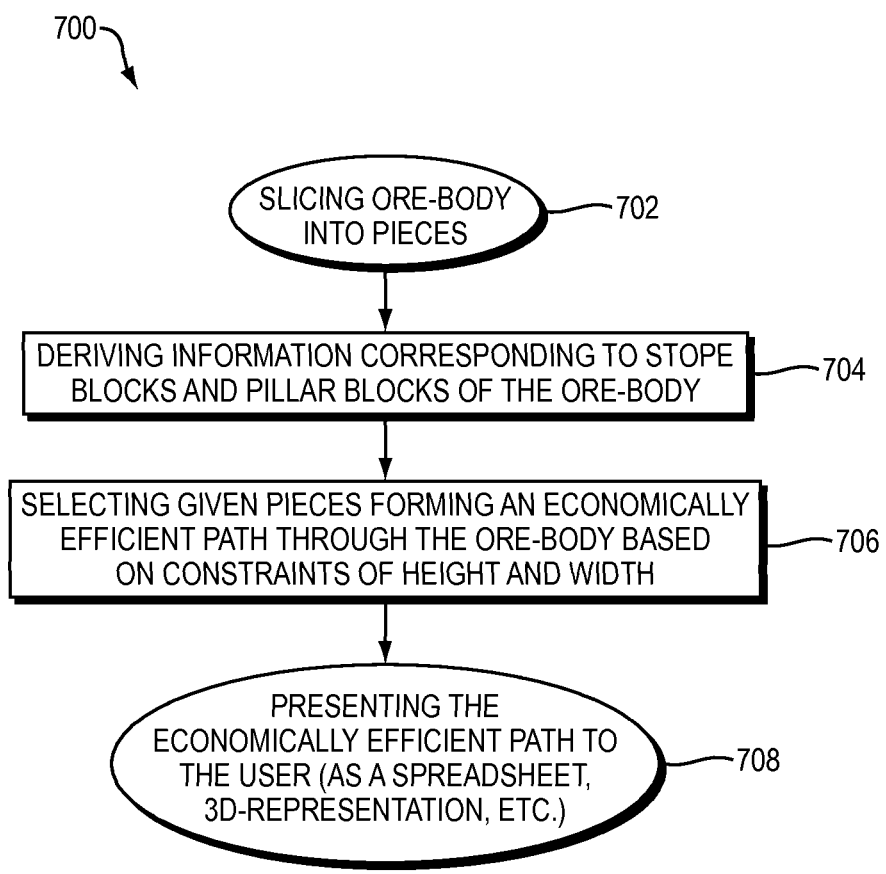
FIG. 7 is a flow diagram illustrating a process employed by an example embodiment of the present invention.

FIG. 7 is a flow diagram 700 illustrating a process employed by an example embodiment of the present invention. The process slices an ore-body into pieces (702). The process derives information corresponding to stope blocks and pillar blocks of the ore-body (704). The process then selects given pieces forming an optimal path through the ore-body based on constraints of height and width (706). The process presents the optimal path to the user (708). The process can present the optimal path to the user as a spreadsheet, 3D-representation, etc.).

Figure 8:
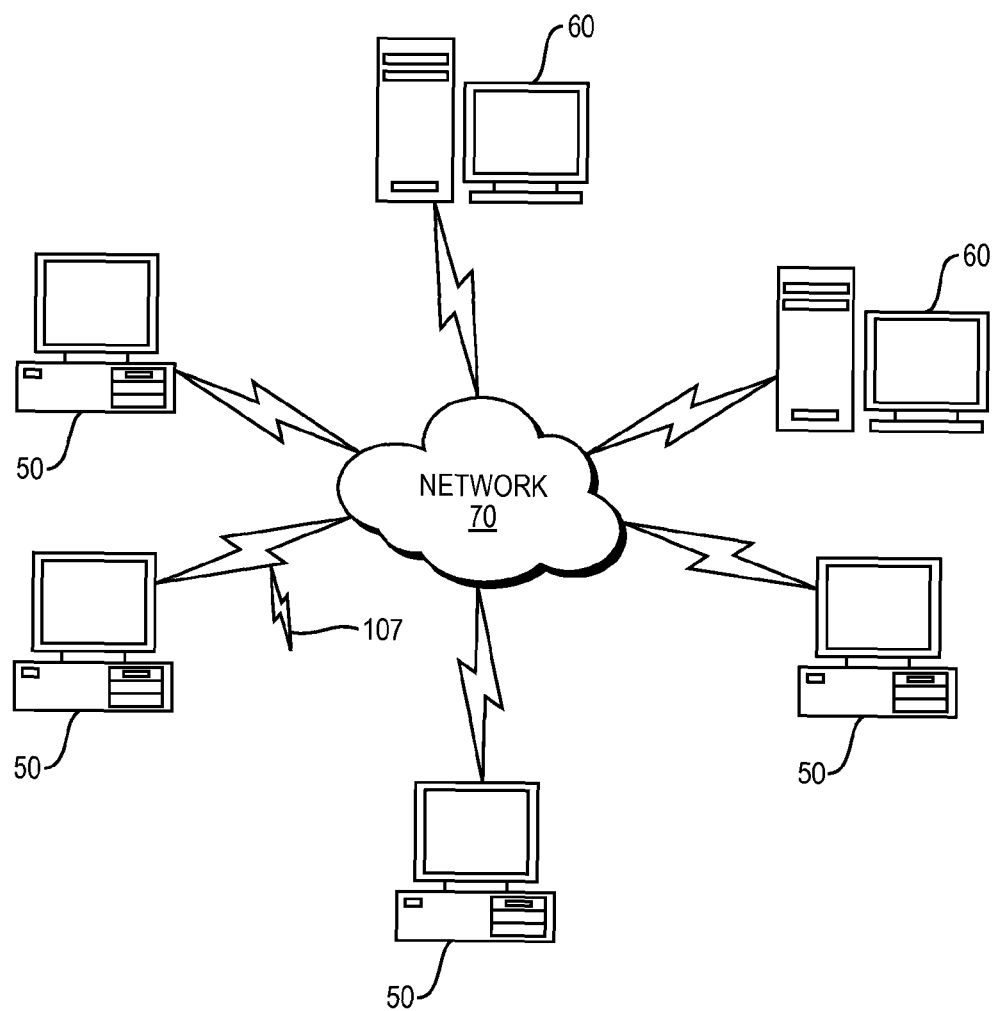
FIG. 8 illustrates a computer network or similar digital processing environment in which embodiments of the present invention may be implemented.

FIG. 8 illustrates a computer network or similar digital processing environment in which embodiments of the present invention may be implemented.

Client computer(s)/devices 50 and server computer(s) 60 provide processing, storage, and input/output devices executing application programs and the like. The client computer(s)/devices 50 can also be linked through communications network 70 to other computing devices, including other client devices/processes 50 and server computer(s) 60. The communications network 70 can be part of a remote access network, a global network (e.g., the Internet), a worldwide collection of computers, local area or wide area networks, and gateways that currently use respective protocols (TCP/IP, Bluetooth®, etc.) to communicate with one another. Other electronic device/computer network architectures are suitable.

Figure 9:
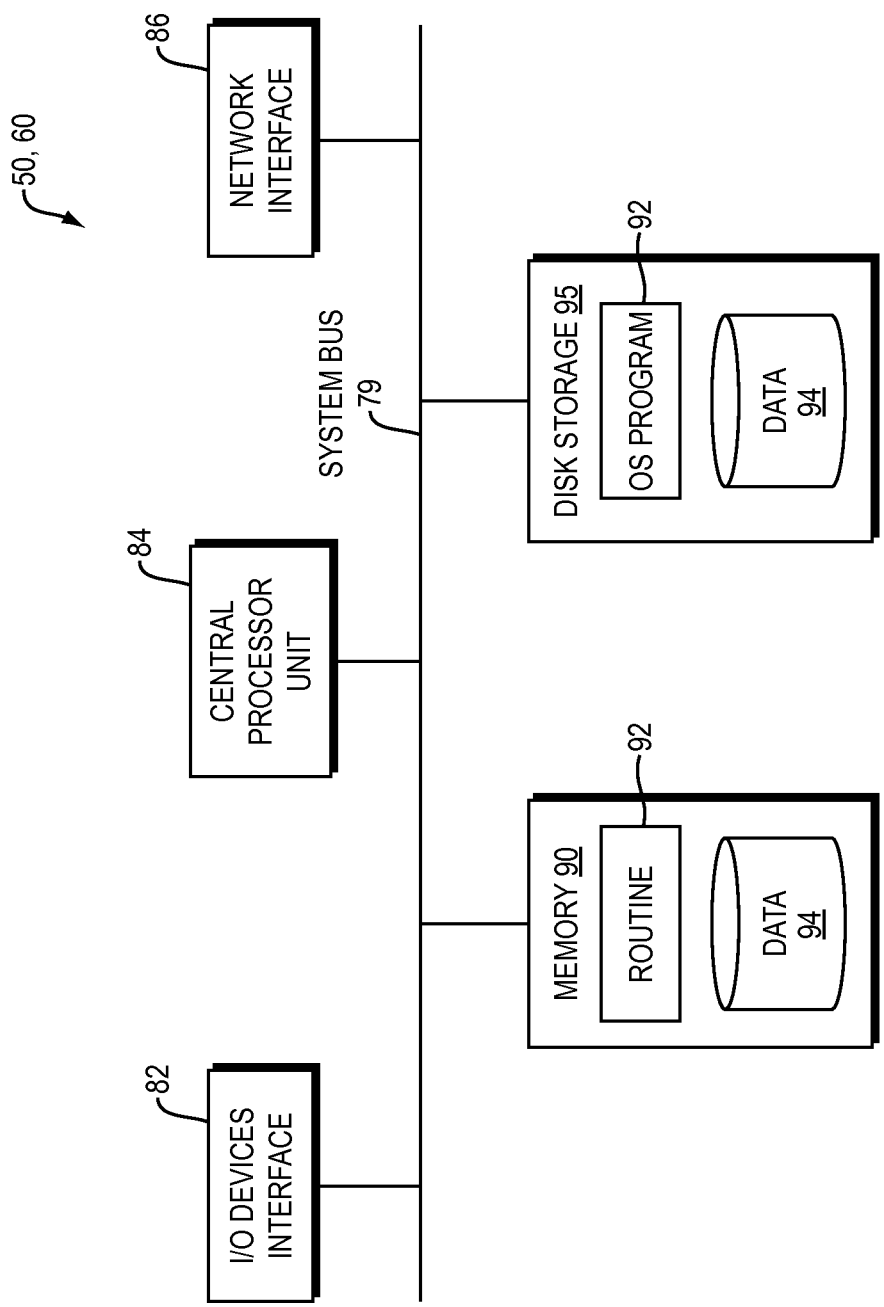
FIG. 9 is a diagram of an example internal structure of a computer (e.g., client processor/device or server computers) in the computer system of FIG. 8.

FIG. 9 is a diagram of an example internal structure of a computer (e.g., client processor/device 50 or server computers 60) in the computer system of FIG. 8. Each computer 50, 60 contains a system bus 79, where a bus is a set of hardware lines used for data transfer among the components of a computer or processing system. The system bus 79 is essentially a shared conduit that connects different elements of a computer system (e.g., processor, disk storage, memory, input/output ports, network ports, etc.) that enables the transfer of information between the elements. Attached to the system bus 79 is an I/O device interface 82 for connecting various input and output devices (e.g., keyboard, mouse, displays, printers, speakers, etc.) to the computer 50, 60. A network interface 86 allows the computer to connect to various other devices attached to a network (e.g., network 70 of FIG. 8). Memory 90 provides volatile storage for computer software instructions 92 and data 94 used to implement an embodiment of the present invention (e.g., optimization module code detailed above). Disk storage 95 provides non-volatile storage for computer software instructions 92 and data 94 used to implement an embodiment of the present invention. A central processor unit 84 is also attached to the system bus 79 and provides for the execution of computer instructions. The disk storage 95 or memory 90 can provide storage for a database. Embodiments of a database can include a SQL database, text file, or other organized collection of data.

In one embodiment, the processor routines 92 and data 94 are a computer program product (generally referenced 92), including a non-transitory computer-readable medium (e.g., a removable storage medium such as one or more DVD-ROM's, CD-ROM's, diskettes, tapes, etc.) that provides at least a portion of the software instructions for the invention system. The computer program product 92 can be installed by any suitable software installation procedure, as is well known in the art. In another embodiment, at least a portion of the software instructions may also be downloaded over a cable communication and/or wireless connection.

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

What is claimed is:

1. A computer-implemented method, the method comprising:
in a processor:
slicing an ore-body solid model stored in a memory into a plurality of horizontal pieces and a plurality of vertical pieces;
deriving, from the plurality of horizontal pieces and the plurality of vertical pieces, information corresponding to stope blocks and pillar blocks of the ore-body, stope blocks and pillar blocks corresponding to particular pieces of the plurality of horizontal pieces and the plurality of vertical pieces;
selecting given horizontal pieces and given vertical pieces forming an optimal path through the ore-body based on constraints of height and width; and
presenting the optimal path to a user.

2. The method of claim 1, wherein the derived information of the stope blocks and pillar blocks includes at least one of a volume, mass, grade, or metal content of the respective stope block or pillar block.

3. The method of claim 1, wherein selecting the given horizontal pieces and given vertical pieces forming the optimal path includes considering one or more of geotechnical parameters, ore-body site conventions, and equipment operating parameters.

4. The method of claim 1, wherein presenting the optimal path to the user includes presenting a 3D-representation of the horizontal pieces and vertical pieces to the user.

5. The method of claim 1, wherein presenting the optimal path to the user includes presenting a spreadsheet illustrating the pieces to be selected for the optimal path.

6. The method of claim 1, wherein selecting the given horizontal pieces and given vertical pieces forming the optimal path further includes creating and solving a weighted digraph representing a plurality of contiguous slices by:
(i) creating a first vertex for a starting position, the starting position corresponding to a fixed pillar preceding a first slice of the contiguous slices,
(ii) creating a second vertex for an ending position, the ending position corresponding to a fixed pillar that follows a last slice of the contiguous slices,
(iii) for each subgroup of contiguous slices that satisfies a given set of height and width constraints to allow a pillar, creating a corresponding vertex,
(iv) for the created vertices of (i)-(iii), connecting two vertices by an edge if, given a set of height and width constraints, a separation can be placed between the slices represented by the two vertices that allows space for a stope,
(v) setting edge directions to be away from the first vertex and towards the second vertex,
(vi) for each edge, setting the weight of the edge by either combining a value of the slices represented by the corresponding source vertex of the edge or combining the value of the slices representing by the corresponding destination vertex of the edge, (vii) for the weighted digraph of (i)-(vi), determining the shortest path from the first vertex to the second vertex.

7. The method of claim 1, wherein the ore-body model represents a boundary of a shape to be mined.

8. The method of claim 1, wherein the ore-body model is a triangulated mesh.

9. A computer-implemented system, the system comprising:
a slicing module configured to slice an ore-body solid model stored in a memory into a plurality of horizontal and a plurality of vertical pieces; and
an analysis module configured to derive, from the plurality of horizontal pieces and the plurality of vertical pieces, information corresponding to stope blocks and pillar blocks of the ore-body, the stope blocks and pillar blocks corresponding to particular pieces of the plurality of horizontal pieces and the plurality of vertical pieces;
wherein the analysis module is further configured to select the given horizontal pieces and given vertical pieces forming the optimal path by considering one or more of geotechnical parameters, ore-body site conventions, and equipment operating parameters.

10. The system of claim 9, wherein the derived information of the stope blocks and pillar blocks includes at least one of a volume, mass, grade, or metal content of the respective stope block or pillar block.

11. The system of claim 9, wherein the analysis module is further configured to select the given horizontal pieces and given vertical pieces forming the optimal path by considering one or more of geotechnical parameters, ore-body site conventions, and equipment operating parameters.

12. The system of claim 9, wherein the user interface module is further configured to present 3D-representation of the horizontal pieces and vertical pieces to the user.

13. The system of claim 9, wherein the user interface module is further configured to present a spreadsheet illustrating the pieces to be selected for the optimal path.

14. The system of claim 9, wherein the analysis module is further configured to select the given horizontal pieces and given vertical pieces forming the optimal path by creating and solving a weighted digraph representing a plurality of contiguous slices by:

(i) creating a first vertex for a starting position, the starting position corresponding to a fixed pillar preceding a first slice of the contiguous slices,
(ii) creating a second vertex for an ending position, the ending position corresponding to a fixed pillar that follows a last slice of the contiguous slices,
(iii) for each subgroup of contiguous slices that satisfies a given set of height and width constraints to allow a pillar, creating a corresponding vertex,
(iv) for the created vertices of (i)-(iii), connecting two vertices by an edge if, given a set of height and width constraints, a separation can be placed between the slices represented by the two vertices that allows space for a stope,
(v) setting edge directions to be away from the first vertex and towards the second vertex,
(vi) for each edge, setting the weight of the edge by either combining a value of the slices represented by the corresponding source vertex of the edge or combining the value of the slices representing by the corresponding destination vertex of the edge,
(vii) for the weighted digraph of (i)-(vi), determining the shortest path from the first vertex to the second vertex.

15. The system of claim 9, wherein the ore-body model represents a boundary of a shape to be mined.

16. The system of claim 9, wherein the ore-body model is a triangulated mesh.

17. A non-transitory computer-readable medium configured to store instructions for analyzing an ore-body solid model, the instructions, when loaded and executed by a processor, causes the processor to:
slice the ore-body solid model stored in a memory into a plurality of horizontal pieces and a plurality of vertical pieces; and
derive, from the plurality of horizontal pieces and the plurality of vertical pieces, information corresponding to stope blocks and pillar blocks of the ore-body, stope blocks and pillar blocks corresponding to particular pieces of the plurality of horizontal pieces and the plurality of vertical pieces; and
select given horizontal pieces and given vertical pieces forming an optimal path through the ore-body based on constraints of height and width; and
present the optimal path to a user.

* * * * *